United States Patent [19]

Scheidel

[11] 4,086,614

[45] Apr. 25, 1978

[54] COATING FOR PASSIVATING A SEMICONDUCTOR DEVICE

[75] Inventor: Fritz Scheidel, Munich, Germany

[73] Assignee: Siemens Aktiengesellschaft, Munich, Germany

[21] Appl. No.: 625,614

[22] Filed: Oct. 24, 1975

[30] Foreign Application Priority Data

Nov. 4, 1974  Germany .............................. 2452289

[51] Int. Cl.² .............................................. H01L 29/34
[52] U.S. Cl. ......................................... 357/54; 357/52; 357/56; 427/93; 427/95
[58] Field of Search ................ 357/54, 52, 56; 427/93, 427/95

[56] References Cited

U.S. PATENT DOCUMENTS

| | | | |
|---|---|---|---|
| 3,386,163 | 6/1968 | Brennemann et al. | 357/54 |
| 3,479,237 | 11/1969 | Bergh et al. | 357/54 |
| 3,481,781 | 12/1969 | Kern | 357/54 |
| 3,511,703 | 5/1970 | Peterson | 357/54 |
| 3,728,167 | 4/1973 | Garber | 357/54 |
| 3,730,766 | 5/1973 | Nishimatsu et al. | 357/54 |
| 3,767,463 | 10/1973 | Aboaf et al. | 357/54 |
| 3,922,709 | 11/1975 | Wallmark et al. | 357/54 |

*Primary Examiner*—Stanley D. Miller, Jr.
*Assistant Examiner*—Joseph E. Clawson, Jr.
*Attorney, Agent, or Firm*—C. L. Menzemer

[57] ABSTRACT

A semiconductor device is described having a body of silicon semiconductor material containing at least one PN junction therein, which PN junction terminates at a peripheral edge surface of the body. A double-layer passivating and protective coating is applied to the edge of the body covering the portion where the PN junction emerges. The inner layer consists of $SiO_2$ and a predetermined percentage of $Al_2O_3$. The outer layer consists of $SiO_2$ and a predetermined percentage of $Al_2O_3$ which exceeds the percentage of $Al_2O_3$ in the inner layer.

4 Claims, 1 Drawing Figure

U.S. Patent     April 25, 1978     4,086,614
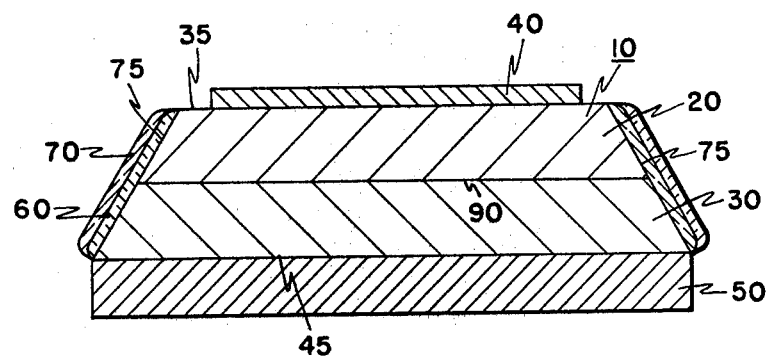

COATING FOR PASSIVATING A SEMICONDUCTOR DEVICE

BACKGROUND OF THE INVENTION

1. Field of the Invention

The present invention pertains to the manufacture of semiconductor devices and more particularly to passivating and protective coatings for silicon semiconductor devices.

2. Description of the Prior Art

It is known in the art that the behavior of a semiconductor device is mainly determined by the charge ratios at the edge (or peripheral surface) of the semiconducting body. In that locality, the free valences present can lead to an expansion of the space charge zone (or depletion layer) and hence to a reduction in the field strength at the edge. When blocking occurs, unsaturated valences of an opposite polarity cause a channel to form in which very high blocking currents flow.

In the past many attempts have been made to develop protective or passivating coatings whereby it is possible to eliminate, or at least neutralize, the adverse conditions which occur on the peripheral edge surface of the semiconductor body. Thus, for example, it is known in the art to employ a layer consisting of silicon dioxide ($SiO_2$) containing a predetermined percentage of aluminum oxide ($Al_2O_3$). By employing such a layer, it is possible to control the charge ratio conditions on the peripheral edge surface of a semiconductor body in order to raise the blocking (or inverse) voltage.

However, the magnitude of the inverse voltage is only one of several important parameters of a quality semiconductor device. Thus, for certain applications semiconductor devices are required that are stable when stored under humid conditions, that is for example, at a temperature of about 70° C, and at a relative humidity of over 90%, when stored for a period of several thousand hours. It has now been found that this requirement is satisfactorily fulfilled by the application of a protective layer consisting of a film of $SiO_2$ containing 3% to 5% by weight of $Al_2O_3$. However, many applications also require that the properties of such a protective layer do not change when the component is held for several thousand hours under "moisture-blocking" conditions (i.e. with similar or the same values of temperature and humidity, and with the application of a dc voltage in the inverse direction).

The simultaneous fulfillment of both requirements can indeed be obtained with an $Al_2O_3$ content in the $SiO_2$, which lies between the two values given above. It has been found, however, in order to obtain reproducible results, it is essential that the optimum $Al_2O_3$ content in the $SiO_2$ must be maintained with precision. Such precise control is relatively difficult and expensive to maintain.

SUMMARY OF THE INVENTION

The present invention concerns a semiconductor device comprising a body of silicon semiconductor material, said body having at least one PN junction therein emerging at a peripheral edge surface of said body, said device having a double layer of silicon dioxide ($SiO_2$) containing predetermined percentage amounts by weight of aluminum oxide ($Al_2O_3$), said double layer being applied to said peripheral edge surface covering said PN junction, said predetermined percentage amounts of $Al_2O_3$ in the $SiO_2$ being such that an outer $SiO_2$ layer contains negative charges and an inner $SiO_2$ layer contains positive charges.

An object of the present invention is to provide a semiconductor device with a protective layer whose composition is appreciably less critical to maintain than prior art devices, yet having the same desirable electrical performance and environmental stability. This object is achieved when the positive charges in the inner $SiO_2$ layer are compensated to a desired degree by the negative charges in the outer $SiO_2$ layer.

BRIEF DESCRIPTION OF THE DRAWING

The sole FIGURE is a vertical cross-sectional view of a device construction in accordance with the present invention.

DESCRIPTION OF THE PREFERRED EMBODIMENT

The FIGURE illustrates a silicon semiconductor body 10 having two zones, 20 and 30, of opposite conductivity type. The zones may be produced, for example, by diffusion of doping agents into the semiconductor body 10 in a known manner. A first major surface 35 of the body 10 is provided with an electrode 40 preferably made of nickel. A second major surface 45 of the body 10 is provided with an electrode 50 preferably made of molybdenum. A double-layer protective and passivating coating, consisting of inner layer 60 and outer layer 70, is applied to peripheral edge surface 75 of the body 10. At the interface of zones 20 and 30 is PN junction 90 which emerges at peripheral edge surface 75, the PN junction 90 being covered by the layers 60 and 70 at surface 75.

The layers 60 and 70 are mainly comprised of $SiO_2$ and contain fractional proportions of $Al_2O_3$. Inner $SiO_2$ layer 60 contains 0% to 2% by weight of $Al_2O_3$ and preferably less than 1% by weight of $Al_2O_3$. Outer $SiO_2$ layer 70 contains 1% to 8% by weight of $Al_2O_3$ and preferably 3% to 5% by weight of $Al_2O_3$. In any event, however, inner $SiO_2$ layer 60 must contain a smaller percentage of $Al_2O_3$ than outer $SiO_2$ layer 70. Inner $SiO_2$ layer 60 has a preferred thickness of 0.02 microns to 0.3 microns with a range of 0.1 to 0.3 being most preferred. Outer $SiO_2$ layer has a preferred thickness of 0.3 microns to 1.0 microns with a range of 0.5 to 0.7 being most preferred.

The above described structure produces the phenomenon whereby negative charges are contained in outer $SiO_2$ layer 70 and positive charges are contained in inner $SiO_2$ layer 60. The thicknesses and relative amounts of $Al_2O_3$ are controlled in the layers 60 and 70 to produce an optimum design whereby the positive charges in inner $SiO_2$ layer 60 are compensated to a desired degree by the negative charges in outer $SiO_2$ layer 70 which results in a desirable widening of the depletion layer of PN junction 90 at peripheral edge surface 75. Control of the degree of charge compensation is achieved by a measurement of the so-called "flat strip" voltage using known MOS techniques.

The layers 60 and 70 may be produced in a known manner on surface 75 of the silicon semiconductor body 10 in the presence of an inert gas such as argon or nitrogen containing a predetermined amount of oxygen. Preferably a vapor of aluminum alkyl such as $Al(CH_3)_3$ containing 0.5% $SiH_4$ will produce the layers 60 and 70 in the presence of an oxidizing atmosphere at 300° C to 400° C. The process is best achieved when the above-mentioned vapor emerges from jets directed at the peripheral edge surface 75 of the body 10 and react with the hot silicon surface 75.

The double layer 60-70 of the present invention produces very good results in reliability testing. For example, only a small percentage of devices failed after being subjected to storage for several thousand hours in a humid environment with an applied inverse voltage.

It will be apparent to those skilled in the art that the present invention is not limited to the particular embodiment of a diode illustrated in the FIGURE. Rather the scope of the present invention includes similar embodiments having more than one PN junction, for example, thyristors and transistors.

It will be further apparent to those skilled in the art that the present invention provides a novel coating for passivating a semiconductor device which enhances the electrical properties of the device while achieving environmental stability.

What is claimed is:

1. A semiconductor device comprising a body of silicon semiconductor material, said body of silicon semiconductor material comprising major opposed flat parallel surfaces, a peripheral edge surface extending between said major opposed surfaces, at least two zones of opposite conductivity type, a PN junction at the interface between said two zones, said PN junction emerging at said peripheral edge surface; a coating for passivating said peripheral edge surface, said coating comprising an inner layer of $SiO_2$ of a predetermined thickness containing from about 0% to about 2%, by weight, of $Al_2O_3$, said inner $SiO_2$ layer being disposed on said peripheral edge surface and covering said PN junction, an outer layer of $SiO_2$ of a predetermined thickness containing from about 1% to about 8%, by weight, of $Al_2O_3$, said outer $SiO_2$ layer being disposed on said inner $SiO_2$ layer, said inner $SiO_2$ layer containing a lesser percentage by weight of $Al_2O_3$ than said outer $SiO_2$ layer, whereby said outer $SiO_2$ layer contains negative charges and said inner $SiO_2$ layer contains positive charges.

2. A semiconductor device comprising a body of silicon semiconductor material, said body of silicon semiconductor material comprising major opposed flat parallel surfaces, a peripheral edge surface extending between said major opposed surfaces, at least two zones of opposite conductivity type, a PN junction at the interface between said two zones, said PN junction emerging at said peripheral edge surface; a coating for passivating said peripheral edge surface, said coating comprising an inner layer of $SiO_2$ of a predetermined thickness containing from 0% to 1%, by weight, of $Al_2O_3$, said inner $SiO_2$ layer being disposed on said peripheral edge surface and covering said PN junction, an outer layer of $SiO_2$ of a predetermined thickness containing from 3% to 5%, by weight, of $Al_2O_3$, said outer $SiO_2$ layer being disposed on said inner $SiO_2$ layer, said inner $SiO_2$ layer containing a lesser percentage by weight of $Al_2O_3$ than said outer $SiO_2$ layer, whereby said outer $SiO_2$ layer contains negative charges and said inner $SiO_2$ layer contains positive charges.

3. A semiconductor device comprising a body of silicon semiconductor material, said body of silicon semiconductor material comprising major opposed flat parallel surfaces, a peripheral edge surface extending between said major opposed surfaces, at least two zones of opposite conductivity type, a PN junction at the interface between said two zones, said PN junction emerging at said peripheral edge surface; a coating for passivating said peripheral edge surface, said coating comprising an inner layer of $SiO_2$ of from about 0.02 microns to about 0.3 microns thick and containing from about 0% to about 2%, by weight, of $Al_2O_3$, said inner $SiO_2$ layer being disposed on said peripheral edge surface and covering said PN junction, an outer layer of $SiO_2$ of from about 0.3 microns to about 1.0 microns thick and containing from about 1% to about 8%, by weight, of $Al_2O_3$, said outer $SiO_2$ layer being disposed on said inner $SiO_2$ layer, said inner $SiO_2$ layer containing a lesser percentage by weight of $Al_2O_3$ than said outer $SiO_2$ layer, whereby said outer $SiO_2$ layer contains negative charges and said inner $SiO_2$ layer contains positive charges.

4. A semiconductor device comprising a body of silicon semiconductor material, said body of silicon semiconductor material comprising major opposed flat parallel surfaces, a peripheral edge surface extending between said major opposed surfaces, at least two zones of opposite conductivity type, a PN junction at the interface between said two zones, said PN junction emerging at said peripheral edge surface; a coating for passivating said peripheral edge surface, said coating comprising an inner layer of $SiO_2$ of from 0.1 to 0.3 microns thick and containing from 0% to 1%, by weight of $Al_2O_3$, said inner $SiO_2$ layer being disposed on said peripheral edge surface and covering said PN junction, an outer layer of $SiO_2$ of from 0.5 microns to 0.7 microns thick and containing from 3% to 5%, by weight, of $Al_2O_3$, said outer $SiO_2$ layer being disposed on said inner $SiO_2$ layer, said inner $SiO_2$ layer containing a lesser percentage by weight of $Al_2O_3$ than said outer $SiO_2$ layer, whereby said outer $SiO_2$ layer contains negative charges and said inner $SiO_2$ layer contains positive charges.

* * * * *